United States Patent
Lu et al.

(10) Patent No.: US 10,771,770 B2
(45) Date of Patent: Sep. 8, 2020

(54) 3D DISPLAY DEVICE AND A DRIVING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengcheng Lu, Beijing (CN); Xiaochuan Chen, Beijing (CN); Wenqing Zhao, Beijing (CN); Ming Yang, Beijing (CN); Lei Wang, Beijing (CN); Rui Xu, Beijing (CN); Jian Gao, Beijing (CN); Xiaochen Niu, Beijing (CN); Haisheng Wang, Beijing (CN); Shengji Yang, Beijing (CN); Changfeng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 293 days.

(21) Appl. No.: 15/538,038

(22) PCT Filed: Dec. 2, 2016

(86) PCT No.: PCT/CN2016/108338
§ 371 (c)(1),
(2) Date: Jun. 20, 2017

(87) PCT Pub. No.: WO2017/092708
PCT Pub. Date: Jun. 8, 2017

(65) Prior Publication Data
US 2017/0374356 A1    Dec. 28, 2017

(30) Foreign Application Priority Data

Dec. 3, 2015 (CN) .......................... 2015 1 0881975

(51) Int. Cl.
*H04N 13/32* (2018.01)
*H04N 13/324* (2018.01)
(Continued)

(52) U.S. Cl.
CPC ............ *H04N 13/32* (2018.05); *G02B 30/26* (2020.01); *G02B 30/27* (2020.01); *H04N 13/312* (2018.05);
(Continued)

(58) Field of Classification Search
None
See application file for complete search history.

(56) References Cited

U.S. PATENT DOCUMENTS

2007/0236619 A1\* 10/2007 Kuo ..................... H04N 13/359
                                                             349/15
2013/0155506 A1   6/2013 Kwon et al.
(Continued)

FOREIGN PATENT DOCUMENTS

CN          101101378 A      1/2008
CN          202160251 U      3/2012
(Continued)

OTHER PUBLICATIONS

International Search Report and Written Opinion dated Mar. 1, 2017; PCT/CN2016/108338.
(Continued)

*Primary Examiner* — Amare Mengistu
*Assistant Examiner* — Sarvesh J Nadkarni

(57) ABSTRACT

A 3D display device and the driving method for the 3D display device are provided. The 3D display device includes
(Continued)

a liquid crystal display panel for monochrome display, and an electroluminescence display panel for color display disposed under the liquid crystal display panel; the electroluminescence display panel includes a plurality of regions arranged in a matrix, the plurality of regions form columns of bright regions and columns of dark regions, which are arranged alternately the liquid crystal display panel includes a plurality of first sub-pixels arranged in a matrix; each bright region of the electroluminescence display panel corresponds to at least two first sub-pixels adjacent in row direction of the liquid crystal display panel.

14 Claims, 6 Drawing Sheets

(51) Int. Cl.
    *H04N 13/312* (2018.01)
    *G02B 30/26* (2020.01)
    *G02B 30/27* (2020.01)
    *H04N 13/356* (2018.01)
    *H04N 13/398* (2018.01)
    *G02F 1/137* (2006.01)
    *H01L 27/15* (2006.01)

(52) U.S. Cl.
CPC ......... *H04N 13/324* (2018.05); *H04N 13/356* (2018.05); *H04N 13/398* (2018.05); *G02F 1/137* (2013.01); *G02F 2201/44* (2013.01); *H01L 27/156* (2013.01)

(56) References Cited

U.S. PATENT DOCUMENTS

| 2013/0241964 A1* | 9/2013 | Ohyama | G09G 3/003 |
| | | | 345/690 |
| 2014/0063001 A1 | 3/2014 | Kim et al. | |
| 2016/0148551 A1* | 5/2016 | Jian | G09G 3/003 |
| | | | 345/419 |
| 2017/0084213 A1* | 3/2017 | Yang | G09G 3/003 |
| 2017/0212358 A1 | 7/2017 | Fan et al. | |

FOREIGN PATENT DOCUMENTS

| CN | 103021295 A | 4/2013 |
| CN | 103313076 A | 9/2013 |
| CN | 104849870 A | 8/2015 |
| CN | 105093546 A | 11/2015 |
| CN | 105093553 A | 11/2015 |
| CN | 105319775 A | 2/2016 |
| JP | 2006-235332 A | 9/2006 |
| WO | 2012/023492 A1 | 2/2012 |

OTHER PUBLICATIONS

The First Chinese Office Action dated Feb. 1, 2018; Appln. No. 201510881975.4.

* cited by examiner

| r1 | r2 | g1 | g2 | b1 | b2 |
|---|---|---|---|---|---|
| r1 | r2 | g1 | g2 | b1 | b2 |
| r1 | r2 | g1 | g2 | b1 | b2 |
| r1 | r2 | g1 | g2 | b1 | b2 |
| r1 | r2 | g1 | g2 | b1 | b2 |
| r1 | r2 | g1 | g2 | b1 | b2 |

# 3D DISPLAY DEVICE AND A DRIVING METHOD THEREOF

TECHNICAL FIELD

Embodiments of the present disclosure relate to a 3D display device and a driving method thereof.

BACKGROUND

The principle of 3D display technology is to make a left eye and a right eye of a viewer receive images with slight difference, that is, a left eye image and a right image. The left eye image and right image are merged in a brain, so that depth information of objects in the images can be perceived by the viewer, and stereoscopic vision can be formed.

For an early 3D display device, the viewer needs to wear corresponding 3D glasses. Naked-eye 3D display devices have been improved a lot in recent years. Naked-eye 3D display devices can be mainly divided into two types: a slit grating type 3D display device and a microlens array type 3D display device. Slit grating also refers to parallax barrier, which is generally realized with a switching type liquid crystal screen, a polymer type liquid crystal layer, and a polarizing film. The liquid crystal molecules in the polymer type liquid crystal layer can be rotated through controlling the voltage difference between the electrodes on the upper and lower substrates of the switching type liquid crystal screen, and therefore, opaque stripes (i.e., the parallax barrier) can be formed. In the case that the switching type liquid crystal screen is turned on, under the influence of the parallax barrier, the image for the left eye can be viewed by the left eye, but cannot be viewed by the right eye; the image for the right eye can be viewed by the right eye, but cannot be viewed by the left eye. In the case that the switching type liquid crystal screen is turned off, the parallax barrier cannot occur in a display panel, and therefore, the display device functions as an ordinary 2D display device.

Currently, a parallax barrier type 3D display device generally can only work in portrait mode or in landscape mode, therefore, the 3D display effect is limited.

SUMMARY

At least one embodiment of the present disclosure provides a 3D display device, which comprise: a liquid crystal display panel for monochrome display, and an electroluminescence display panel for color display disposed under the liquid crystal display panel; wherein, the electroluminescence display panel comprises a plurality of regions arranged in a matrix; the plurality of regions form columns of bright regions and columns of dark regions, which are arranged alternately; in 3D display portrait mode, each column of bright regions comprises bright regions with a same emitting color, and adjacent columns of bright regions have different emitting colors; in 3D display landscape mode, each column of bright regions comprises bright regions, which are adjacent in column direction, with different emitting colors, and the emitting colors of the bright regions, which are provided in a same row, of each column of bright regions are the same; the liquid crystal display panel comprises a plurality of first sub-pixels arranged in a matrix; each bright region of the electroluminescence display panel corresponds to at least two first sub-pixels adjacent in row direction of the liquid crystal display panel; in 3D display mode, in each of the first sub-pixels corresponding to a same bright region, grey scales displayed by the first sub-pixels, which are configured to provide grey scale information of images of different viewpoints, are different from each other.

In one embodiment according to the present disclosure, in the above 3D display device provided by the embodiment of present disclosure, in 2D display mode, the grey scales displayed by the first sub-pixels, which correspond to the same bright region, are set to be the same, so as to make the 3D display device in 2D display mode.

In one embodiment according to the present disclosure, in 3D display landscape mode of the above 3D display device, the dark regions are disposed between the bright regions, which are adjacent in column direction, with different emitting colors.

In one embodiment according to the present disclosure, each of the bright regions and each of the dark regions respectively comprise one or more second sub-pixels.

In one embodiment according to the present disclosure, a shape of each of the bright regions is square or round, and an aspect ratio of each of the first sub-pixels is 1:1.

In one embodiment according to the present disclosure, a central position of each of the bright regions coincides with a central position of a region where the corresponding first sub-pixel is located.

In one embodiment according to the present disclosure, in 3D display portrait mode, each of the bright regions corresponds to N adjacent first sub-pixels, which are provided in a row; in 3D display landscape mode, each of the bright regions corresponds to M*N first sub-pixels, which are provided in N rows, adjacent in row direction or in column direction, wherein, M and N are integers larger than 1.

In one embodiment according to the present disclosure, M and N are even numbers; in 3D display portrait mode, the grey scales respectively displayed by N/2 first sub-pixels on the left side and N/2 first sub-pixels on the right side of the first sub-pixels corresponding to a same bright region are different; in 3D display landscape mode, the grey scales respectively displayed by M*N/2 first sub-pixels on the left side and M*N/2 first sub-pixels on the right side of the first sub-pixels corresponding to the same bright region are different.

At least one embodiment of present disclosure provides a driving method for the above 3D display devices, which comprises: controlling regions of an electroluminescence display panel disposed under a liquid crystal display panel to form columns of bright regions and columns of dark regions, which are arranged alternately; and controlling first sub-pixels, which correspond to a same bright region, of the liquid crystal display panel to display different grey scale information, so as to make the 3D display device in 3D display mode; in 3D display portrait mode, each column of bright regions comprises bright regions with a same emitting color, and adjacent columns of bright regions have different emitting colors; in 3D display landscape mode, each column of bright regions comprises bright regions, which are adjacent in column direction, with different emitting colors, and the emitting colors of the bright regions, which are provided in a same row, of each column of the bright regions are the same.

In one embodiment according to the present disclosure, the driving method further comprises: in 2D display mode, controlling the first sub-pixels, which correspond to a same bright region, in the liquid crystal display panel to display the same grey scale information.

In one embodiment according to the present disclosure, the driving method further comprises: in 3D display landscape mode, controlling to form the dark regions between the bright regions, which are adjacent in column direction, with different emitting colors.

In one embodiment according to the present disclosure, in 3D display portrait mode, each of the bright regions corresponds to N adjacent first sub-pixels, which are provided in a row, N is an even numbers; the driving method further comprises controlling N/2 first sub-pixels on the left side and N/2 first sub-pixels on the right side of the first sub-pixels corresponding to a same bright region to display different grey scales; in the 3D display landscape mode, each of the bright regions corresponds to M*N first sub-pixels, which are provided in N rows, adjacent in row direction or in column direction, M is an even numbers; the driving method further comprises controlling M*N/2 first sub-pixels on the left side and M*N/2 first sub-pixels on the right side of the first sub-pixels corresponding to a same bright region to display different grey scales.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 5 is a top view of a 3D display device, which is in 3D display portrait mode, according to an embodiment of the present disclosure; and FIG. 6a-FIG. 6c and FIG. 7 are top views of a 3D display device, which is in 3D display landscape mode, according to an embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The shape and size of every element of the drawings only intend to illustrate the content of present disclosure, and not intend to reflect the actual ratio.

Figure 1:
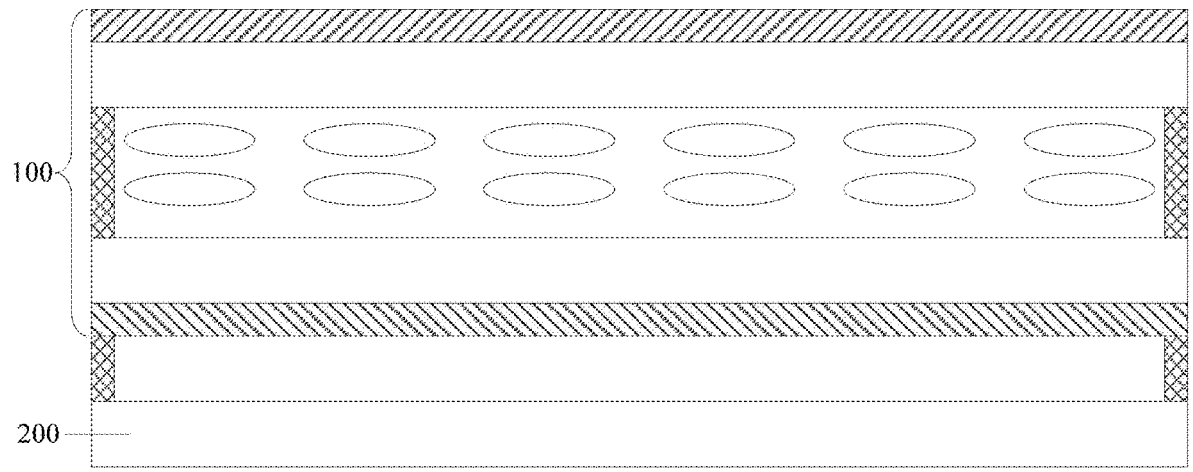
FIG. 1 is a schematically structural view of a 3D display device according to an embodiment of present disclosure.

At least one embodiment of the present disclosure provides a 3D display device, as illustrated in FIG. 1, the 3D display device comprises a liquid crystal display panel for monochrome display 100, and an electroluminescence display panel for color display 200 disposed under the liquid crystal display panel 100.

Figure 2A:
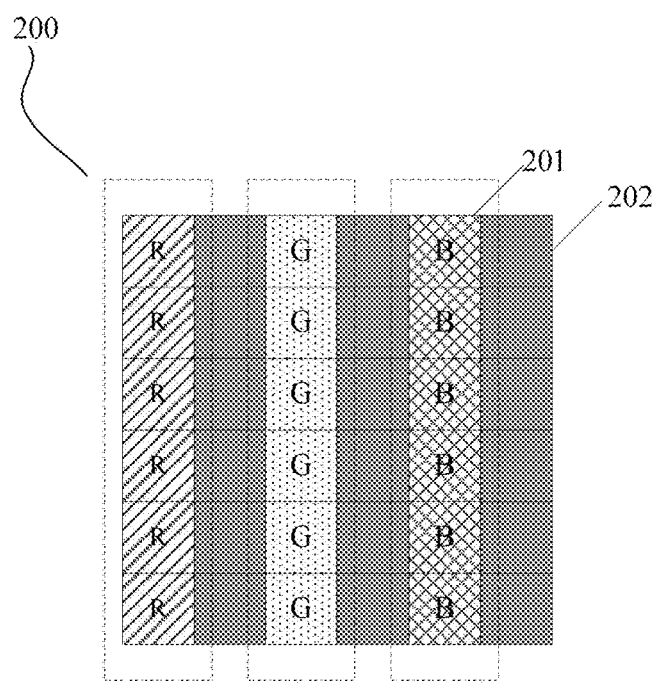
FIG. 2a is a schematic diagram of an electroluminescence display panel, which is in 3D display portrait mode, of a 3D display device according to an embodiment of the present disclosure.
Figure 2B:
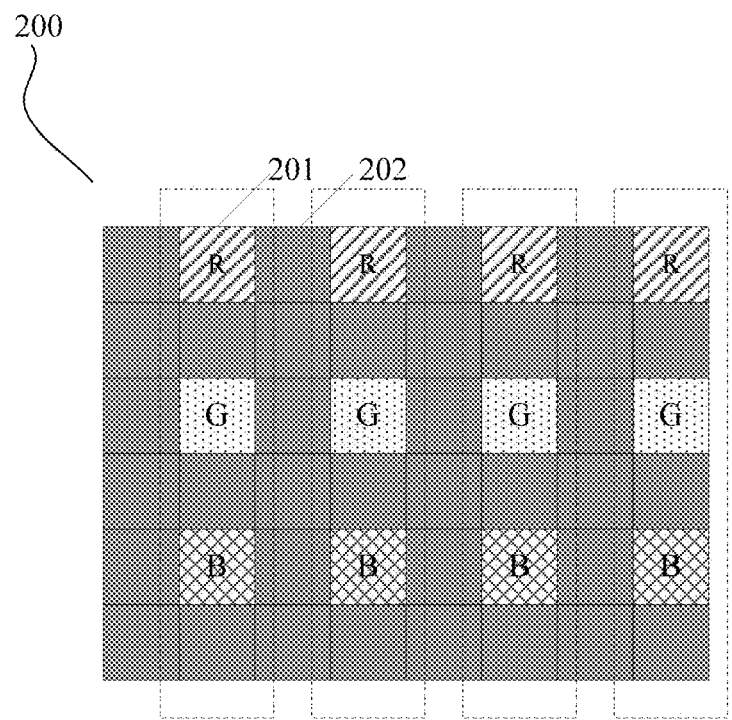
FIG. 2b-FIG. 2d are schematic diagrams of an electroluminescence display panel, which is in 3D display landscape mode, of a 3D display device according to an embodiment of the present disclosure.
Figure 2C:
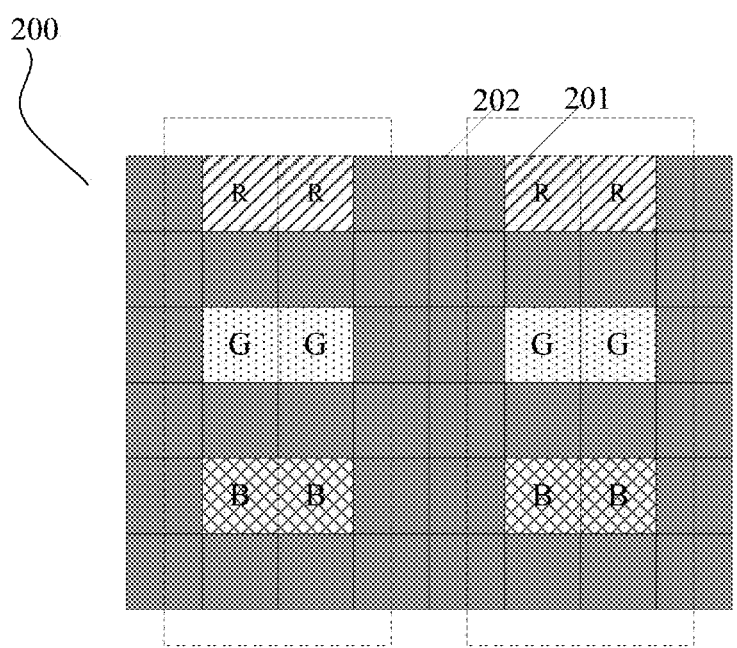
Figures 2D, 3:
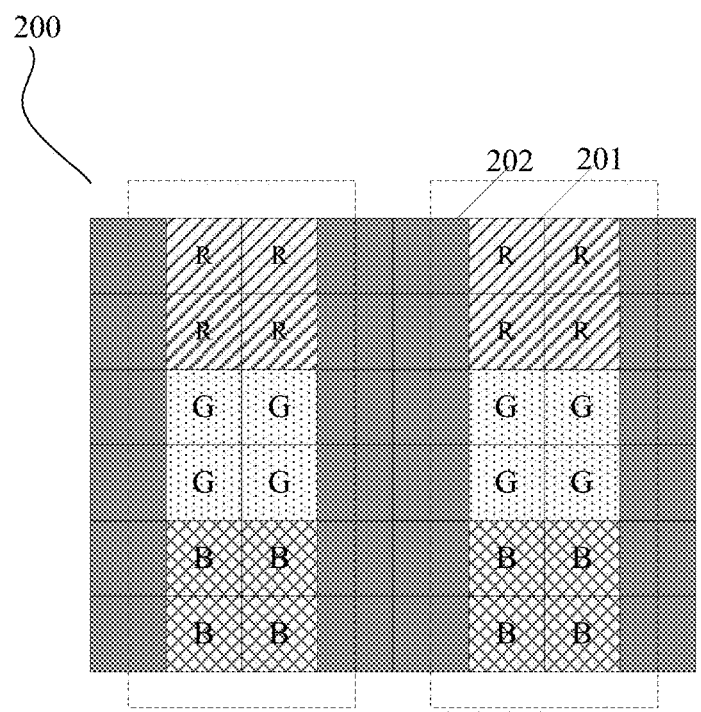
FIG. 3 is a schematic diagram of a liquid crystal display panel of a 3D display device according to an embodiment of the present disclosure.

As illustrated in FIG. 2a-FIG. 2d, the electroluminescence display panel 200 comprises a plurality of light-emitting diodes (which are not illustrated in the figures) arranged in a matrix, the plurality of light-emitting diodes can form a plurality of regions. For example, in 3D display mode, columns of bright regions 201 and columns of dark regions 202, which are arranged alternately, can be formed through controlling whether the light-emitting diodes emit light or not; the light-emitting diodes corresponding to the bright region 201 emit light, and the light-emitting diodes corresponding to the dark region 202 do not emit light. As illustrated in FIG. 2a, in 3D display portrait mode, each column of bright regions 201 comprises bright regions with a same emitting color, and adjacent columns of bright regions 201 have different emitting colors; in FIG. 2a, the bright regions 201 with a red (R) emitting color, a green (G) emitting color and a blue (B) emitting color constitute 3 columns of bright regions (illustrated by the dashed box in the figure). As illustrated in FIG. 2b-FIG. 2d, in 3D display landscape mode, each column of bright regions 201 comprises bright regions 201, which are adjacent in column direction, with different emitting colors, and the emitting colors of the bright regions, which are provided in a same row, of the each column of bright regions 201 are the same; the dark regions 202 are disposed between columns of bright regions 201. Providing dark regions 202 means making the light-emitting diodes disposed between bright regions do not emit light. FIG. 2b-FIG. 2d illustrate structures obtained through making the electroluminescence display panel illustrated in FIG. 2a to rotate 90 degrees; FIG. 2b illustrates the case that four columns of bright regions (illustrated by the dashed box in the figure) are formed by bright regions 201 with the red (R) emitting color, the green (G) emitting color and the blue (B) emitting color; FIG. 2c and FIG. 2d respectively illustrate the case that two columns of bright regions (illustrated by the dashed box in the figure) are formed by bright regions 201 with the red (R) emitting color, the green (G) emitting color and the blue (B) emitting color.

As illustrated in FIG. 3, the liquid crystal display panel 100 comprises a plurality of first sub-pixels 101 arranged in matrix; each bright region 201 of the electroluminescence display panel 200 corresponds to at least two first sub-pixels 101 adjacent in row direction of the liquid crystal display panel 100; in 3D display mode, in each of the first sub-pixels 101 corresponding to a same bright region 201, grey scales displayed by the first sub-pixels 101, which are configured to provide grey scale information of images of different viewpoints, are different from each other. FIG. 3 takes the example that a bright region 201 corresponds to two first sub-pixels 101 adjacent in row direction to illustrate the embodiment. The arrangement of the first sub-pixels 101 of FIG. 3 corresponds to the bright region 201 illustrated by FIG. 2a; the first sub-pixels r1 and r2, which are adjacent in row direction, of the liquid crystal display panel 100 correspond to the bright region R of the electroluminescence display panel 200; the first sub-pixels g1 and g2 correspond to the bright region G; the first sub-pixels b1 and b2 correspond to the bright region B.

The 3D display device according to the above embodiment of the present disclosure, a conventional backlight can be replaced through disposing the electroluminescence display panel 200 under the liquid crystal display panel 100, so as to make the overall 3D display device light and thin. In 3D display mode, columns of bright regions 201 and columns of dark region 202, which are arranged alternately, are formed in the electroluminescence display panel 200, so as to form a grating structure; the electroluminescence display panel 200 is not only configured to provide backlight for the liquid crystal display panel 100, but also configured to function as a rear mounted 3D grating, therefore, the 3D grating in front of the liquid crystal display panel 100 can be avoided, which is in favor of making the overall 3D display device light and thin, and in favor of adding additional functions such as a touch control function in a front-mounted liquid crystal display panel 100; furthermore, because a brightness of a dark state of the electroluminescence display panel 200 is approximately zero, a contrast ratio of a bright state and the dark state is large, and thus the 3D display device with low cross-talk can be easily obtained through the formed 3D grating.

Figure 4A:
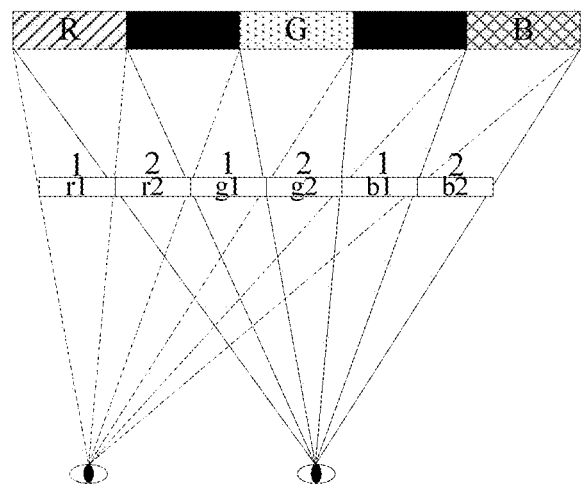
FIG. 4a-FIG. 4b are schematic diagrams of 3D display principle of a 3D display device according to an embodiment of the present disclosure.

In the above 3D display device according to the embodiment of the present disclosure, each bright region 201 of the electroluminescence display panel corresponds to at least two first sub-pixels 101 adjacent in row direction of the liquid crystal display panel 100, and the first sub-pixels 101 of the liquid crystal display panel 100 are configured to provide different grey scale information of images of different viewpoints; therefore, as illustrated in FIG. 4a, in 3D display mode, the first sub-pixels 101, which are configured to provide grey scale information of images of different viewpoints, corresponding to a same bright region are controlled to display different grey scale information, so as to make adjacent viewpoints receive images with different grey scale information; in the case that a left eye and a right eye of a person are at the position of the above two viewpoints, two different images can be received, and a 3D image can be formed in a brain with the received two different images, therefore, stereoscopic vision can be formed and sub-pixel level naked-eye 3D display can be realized. FIG. 4a illustrates a case of realizing two viewpoints through taking an example that a bright region 201 corresponds to two first sub-pixels 101; "1" and "2" in FIG. 4a represent different grey scales, the left eye receives image information with grey scale of "1", and the right eye receives image information with grey scale of "2". For example, a bright region 201 can correspond to three first sub-pixels 101, i.e., to realize three viewpoints; a bright region 201 can also correspond to four first sub-pixels 101 to realize four viewpoints or two viewpoints (i.e., two adjacent first sub-pixels 101 correspond to one viewpoint), and so on and so forth.

Figure 4B:
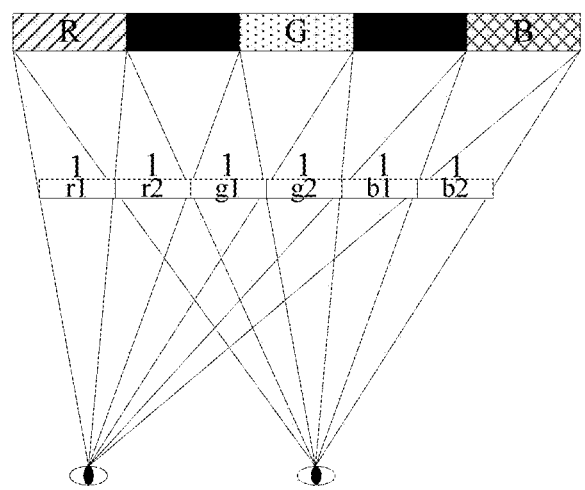

Furthermore, in the case that the above 3D display device provided by the embodiment of the present disclosure needs to display 2D images, that is, the above 3D display device is in 2D display mode, as illustrated in FIG. 4b, the left eye and the right eye of a person can view two identical images at different viewpoints through making the first sub-pixels 101, which correspond to a same bright region 201, of the liquid crystal display panel 100 display same grey scale, and thus 2D display can be realized. FIG. 4b illustrates a case of realizing two viewpoints through taking an example that a bright region 201 corresponds to two first sub-pixel 101, "1" in FIG. 4b represents same grey scale.

In an embodiment of present disclosure, the electroluminescence display panel 200 of the 3D display device is a color display panel, that is, each of the bright regions 201 further provides hue information. Therefore, it's not necessary to provide filters in each first sub-pixel 101 of the liquid crystal display panel 100, which is in favor of improving the brightness of the 3D display device. Furthermore, the liquid crystal display panel 100 without filters can realize 3D display in both portrait mode and landscape mode. For the liquid crystal display panel with filters, in order to realize 3D display, the filters of the first sub-pixels 101, which correspond to a same bright region 201, of the liquid crystal display panel 100 are the same. Therefore, the 3D display device can only realize 3D display in one direction (i.e., in portrait mode or in landscape mode). In the case that the 3D display device is rotated 90 degrees, the first sub-pixels 101, which correspond to a same bright region 201 and a same filter, are turned into adjacent in column direction from adjacent in row direction, and therefore, the 3D display's requirement that different viewpoints are located in a same horizontal plane cannot be fulfilled, and the 3D display cannot be realized. However, the problem that the display direction of the 3D display device, which is in 3D display mode, is limited by the position of the filters are not existed in the 3D display device with the liquid crystal display panel for monochrome display 100, that is, the 3D display can still be realized after the screen being rotated 90 degrees through changing the position of the bright regions 201 in the electroluminescence display panel, and the position of the first sub-pixels 101, which correspond to the bright regions 201, in the liquid crystal display panel.

Furthermore, in one embodiment of the present disclosure, in order to reduce the display difference between the 3D display portrait mode and the 3D display landscape mode, the shape of each bright region 201 can be square or round, that is, an aspect ratio of each of the first sub-pixels is 1:1. Thereby, after the screen being rotated, the view distance of the eye can maintain unchanged, and the brightness of the image is uniform; therefore, rotating of the screen will not cause large difference in the 3D display effect, and the viewing experience can be ensured. Obviously, the shape of each bright region 201 can be other shapes, no further description will be given herein.

Furthermore, in order to realize the switching between portrait screen and landscape screen in 3D display mode, in the 3D display device according to one embodiment of the present disclosure, the bright regions 201 and dark regions 202 of the electroluminescence display panel 200 can be set to correspond to a second sub-pixel. For example, one bright region 201 or one dark region 202 can be set to correspond to one second sub-pixel, one bright region 201 or one dark region 202 can also be set to correspond to a plurality of second sub-pixels, but this embodiment is not limited to this case. The electroluminescence display panel illustrated in FIG. 2a, which is in portrait mode, is changed into landscape mode after being rotated 90 degrees. As illustrated in FIG. 2b and FIG. 2c, in 3D display landscape mode, the dark regions 202 disposed between the bright regions 201, which are adjacent in column direction, with different emitting colors are maintained, that is, the dark regions 202 disposed between the bright regions R, G and B, which are adjacent in column direction, are maintained; furthermore, new dark regions 202 can be formed through turning off the light-emitting diodes in bright regions 201, which are located in alternate columns of a row of bright regions 201 with a same emitting color. As illustrated in FIG. 2d, in 3D display landscape mode, the dark regions 202 disposed between the bright regions 201, which are adjacent in column direction, with different emitting colors can also be changed into bright regions 201. Furthermore, in the case that realizing the switching of the 3D display mode from portrait mode to landscape mode through turning off the light-emitting diodes in some bright region 201, which is in portrait mode and emits light, the bright regions 201 can be set to correspond to the second sub-pixel.

In the 3D display device according to one embodiment of the present disclosure, in order to realize 3D display, in despite of the display mode (i.e., portrait mode or landscape mode) of the display device, a central position of each of the bright regions 201 in the electroluminescence display panel 200 can be set to align with (i.e., coincides with) a central position of a region where the corresponding first sub-pixel is located.

Figures 5, 6A, 6B:
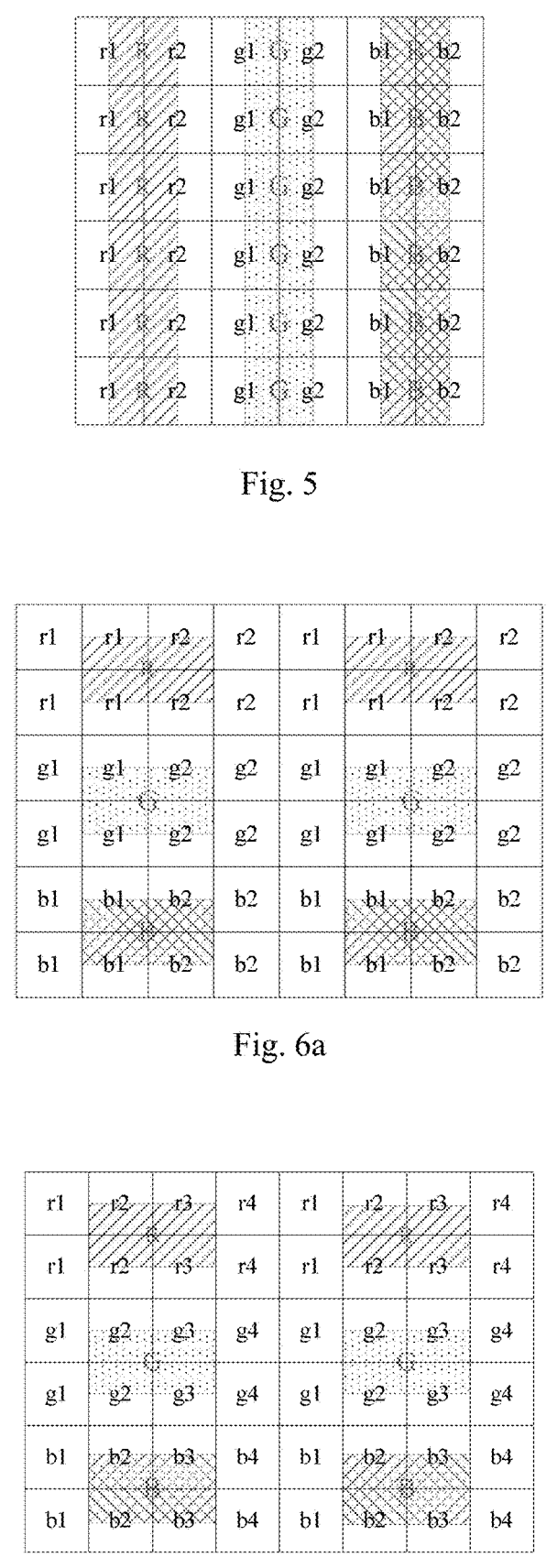
Figures 6C, 7:
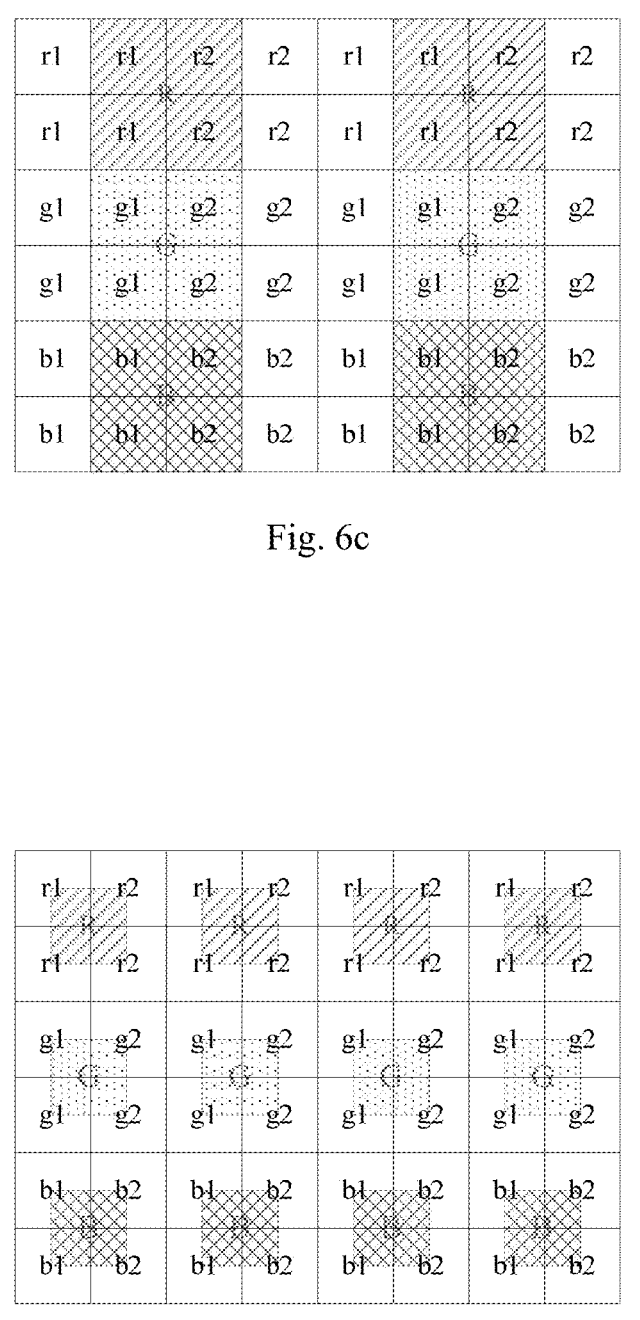

Thereby, in 3D display portrait mode, each of the bright regions 201 is set to correspond to N adjacent first sub-pixels 101, which are provided in a row; in 3D display landscape mode, each of the bright regions is set to correspond to M*N first sub-pixels, which are provided in N rows, adjacent in row direction or in column direction, M and N are integers larger than 1. For example, N=2, in 3D display portrait mode illustrated in FIG. 5, each of the bright regions 201 corresponds to two first sub-pixels 101 adjacent in row direction; the bright region R is located in the central position of the region where the first sub-pixel r1 and r2, which are adjacent in row direction, are located; the bright region G is located in the central position of the region where the first sub-pixel g1 and g2, which are adjacent in row direction, are located; the bright region B is located in the central position of the region where the first sub-pixel b1 and b2, which are adjacent in row direction, are located. In the case of M=4, the portrait mode illustrated in FIG. 5 is changed into the landscape mode after being rotated 90 degrees. In a row of the bright region 201 with a same emitting color, turning off two adjacent bright regions 201 for every four bright regions 201, so as to form dark regions 202, as illustrated in FIG. 6a and FIG. 6b. On this basis, as illustrated in FIG. 6c, the original dark regions 202 disposed between two bright regions 201 adjacent in column direction can be further changed into bright region 201. Herein, the 3D display cannot be realized in the case that the grey scale modulation of the first sub-pixels 101 corresponding to the bright region 201 is performed according to the correspondence of portrait mode, and therefore, the correspondence between the bright regions 201 and the first sub-pixels 101 has to be re-determined. As illustrated in FIG. 6a-FIG. 6c, one bright region 201 corresponds to eight first sub-pixels 101, which are located in two rows and four columns. In the case of M=2, the portrait mode illustrated in FIG. 5 is changed into the landscape mode after being rotated 90 degrees. In a row of the bright region 201 with a same emitting color, turning off one bright region 201 for every two bright regions 201, so as to form dark regions 202, as illustrated in FIG. 7. Herein, the 3D display cannot be realized in the case that the grey scale modulation of the first sub-pixels 101 corresponding to the bright region 201 is performed according to the correspondence of portrait mode, and therefore, the correspondence between the bright regions 201 and the first sub-pixels 101 has to be re-determined. As illustrated in FIG. 7, one bright region 201 corresponds to four first sub-pixels 101, which are located in two rows and two columns.

Furthermore, in the cast that m and n are even numbers, two viewpoints can be realized. That is, in 3D display portrait mode, the grey scales respectively displayed by N/2 first sub-pixels 101 on the left side and N/2 first sub-pixels 101 on the right side of the first sub-pixels 101 corresponding to a same bright region 201 are different; in 3D display landscape mode, the grey scales respectively displayed by M*N/2 first sub-pixels 101 on the left side and M*N/2 first sub-pixels 101 on the right side of the first sub-pixels 101 corresponding to a same bright region 201 are different. For example, in the case of N=2, in the portrait mode illustrated in FIG. 5, each of the bright regions 201 corresponds to two first sub-pixels 101, which are configured to display different grey scale information in 3D display mode. In the case of M=2, as illustrated in FIG. 7, the first column of first sub-pixels 101 and the second column of first sub-pixels 101 can be set to display different grey scale information, so as to realize two-viewpoint display. In the case of M=4, as illustrated in FIG. 6a and FIG. 6c, the 4*4 first sub-pixels 101 on the left side of the first sub-pixels 101 can be set to display same grey scale information, the 4*4 first sub-pixels 101 on the right side of the first sub-pixels 101 can be set to display another same grey scale information, so as to realize two-viewpoint display. Furthermore, as illustrated in FIG. 6b, the first column, second column, third column and fourth column of first sub-pixels 101 can be set to display different grey scale information, so as to realize four-viewpoint display.

Based on a same inventive idea, at least one embodiment of the present disclosure further provides a driving method for the above 3D display devices, which comprises the following steps: in 3D display mode, controlling regions of an electroluminescence display panel disposed under a liquid crystal display panel to form columns of bright regions and columns of dark regions, which are arranged alternately; in 3D display portrait mode, each column of bright regions comprises bright regions with a same emitting color, and adjacent columns of bright regions have different emitting colors; in 3D display landscape mode, each column of bright regions comprises bright regions, which are adjacent in column direction, with different emitting colors, and the emitting colors of the bright regions, which are provided in a same row, of each column of the bright regions are the same; furthermore, controlling first sub-pixels, which correspond to a same bright region, of the liquid crystal display panel to display different grey scale information, so as to make the first sub-pixels, which are configured to provide grey scale information of images of different viewpoints, to display different grey scale information.

Furthermore, in the above driving method provided by the embodiment of the present disclosure, in order to realize 2D display, the driving method can further comprise: in 2D display mode, controlling the first sub-pixels, which correspond to a same bright region, in the liquid crystal display panel to display the same grey scale information.

Furthermore, the above driving method provided by the embodiment of the present disclosure can further comprise: in 3D display landscape mode, controlling to form the dark regions 202 between the bright regions, which are adjacent in column direction, with different emitting colors.

Furthermore, in order to realize two-viewpoint 3D display in portrait mode and in landscape mode, in the above driving method provided by the embodiment of the present disclosure, in 3D display portrait mode, each of the bright regions corresponds to N adjacent first sub-pixels, which are provided in a row, N is an even numbers; the driving method further comprises controlling N/2 first sub-pixels on the left side and N/2 first sub-pixels on the right side of the first sub-pixels corresponding to a same bright region to display different grey scales. In 3D display landscape mode, each of the bright regions corresponds to M*N first sub-pixels, which are provided in N rows, adjacent in row direction or in column direction, M is an even numbers; the driving method further comprises controlling M*N/2 first sub-pixels on the left side and M*N/2 first sub-pixels on the right side of the first sub-pixels corresponding to a same bright region to display different grey scales.

In the 3D display device and its driving method according to the embodiment of the present disclosure, the electroluminescence display panel for color display disposed under the liquid crystal display panel for monochrome display can replace the conventional backlight and can provide hue information of the displayed images, which can make the overall 3D display device light and thin. In 3D display portrait mode or in 3D display landscape mode, columns of bright regions 201 and columns of dark regions 202, which are arranged alternately, can be formed in the electroluminescence display panel 200, and therefore, a grating structure can be formed. Thereby, the electroluminescence display panel 200 can not only be configured to provide backlight for the liquid crystal display panel 100, but can also be configured to function as a rear mounted 3D grating, therefore, the 3D grating in front of the liquid crystal display panel 100 can be avoided, which is in favor of making the overall 3D display device light and thin, and in favor of adding additional functions such as touch control function in a front-mounted liquid crystal display panel 100; furthermore, because a brightness of a dark state of the electroluminescence display panel 200 is approximately zero, a contrast ratio of a bright state and the dark state is large, and thus the 3D display device with low cross-talk can be easily obtained through the formed 3D grating. Each of the bright regions of the electroluminescence display panel corresponds to at least two first sub-pixels adjacent in row direction of the liquid crystal display panel, and the first sub-pixels 101 of the liquid crystal display panel 100 are configured to provide different grey scale information of images of different viewpoints. Therefore, in 3D portrait mode or 3D landscape mode, the first sub-pixels, which are configured to provide grey scale information of images of different viewpoints, corresponding to a same bright region are controlled to display different grey scale information, so as to make adjacent viewpoints receive images with different grey scale information; in the case that a left eye and a right eye of a person are at the position of the above two viewpoints, two different images can be received, and a 3D image can be formed in a brain with two different images received by eyes, therefore, stereoscopic vision can be formed and sub-pixel level naked-eye 3D display can be realized.

What are described above is related to the illustrative embodiments of the disclosure only and not limitative to the scope of the disclosure; the scopes of the disclosure are defined by the accompanying claims.

The application claims priority to the Chinese patent application No. 201510881975.4, filed Dec. 3, 2015, the entire disclosure of which is incorporated herein by reference as part of the present application.

What is claimed is:

1. A 3D display device, comprising: a liquid crystal display panel for monochrome display, and an electroluminescence display panel for color display disposed under the liquid crystal display panel; wherein, the electroluminescence display panel comprises a plurality of regions arranged in a matrix, the plurality of regions form columns of bright regions and columns of dark regions, which are arranged alternately; in a 3D display portrait mode, each column of bright regions comprises bright regions with a same emitting color, and adjacent columns of bright regions have different emitting colors; in a 3D display landscape mode, each column of bright regions comprises bright regions, which are adjacent in a column direction, with different emitting colors, and the emitting colors of the bright regions, which are provided in a same row, of each column of bright regions are the same; and the liquid crystal display panel comprises a plurality of first sub-pixels arranged in a matrix; each bright region of the electroluminescence display panel corresponds to at least two first sub-pixels adjacent in a row direction of the liquid crystal display panel; in the 3D display portrait mode and the 3D display landscape mode, in each of the first sub-pixels corresponding to a same bright region, grey scales displayed by the first sub-pixels, which are configured to provide grey scale information of images of different viewpoints, are different from each other;

in the 3D display portrait mode, each of the bright regions corresponds to N adjacent first sub-pixels, which are provided in a row; and in the 3D display landscape mode, each of the bright regions corresponds to M*N first sub-pixels, which are provided in N rows, adjacent in the row direction or in the column direction, wherein, M and N are integers larger than 1; and M and N are even numbers:
in the 3D display portrait mode, the grey scales respectively displayed by N/2 first sub-pixels on the left side and N/2 first sub-pixels on a right side of the first sub-pixels corresponding to a same bright region are different; and
in the 3D display landscape mode, the grey scales respectively displayed by M*N/2 first sub-pixels on the left side and M*N/2 first sub-pixels on the right side of the first sub-pixels corresponding to a same bright region are different.

2. The 3D display device according to claim 1, wherein, in the 3D display landscape mode, the dark regions are disposed between the bright regions, which are adjacent in the column direction, with different emitting colors.

3. The 3D display device according to claim 2, wherein, each of the bright regions and each of the dark regions respectively comprise one or more second sub-pixels.

4. The 3D display device according to claim 2, wherein a shape of each of the bright regions is square or round, and an aspect ratio of each of the first sub-pixels is 1:1.

5. The 3D display device according to claim 2, wherein a central position of each of the bright regions coincides with a central position of a region where a corresponding first sub-pixel is located.

6. The 3D display device according to claim 2, wherein the grey scales of the first sub-pixels corresponding to a same bright region are set to be the same, so as to make the 3D display device in a 2D display mode.

7. The 3D display device according to claim 1, wherein, each of the bright regions and each of the dark regions respectively comprise one or more second sub-pixels.

8. The 3D display device according to claim 1, wherein a shape of each of the bright regions is square or round, and an aspect ratio of each of the first sub-pixels is 1:1.

9. The 3D display device according to claim 1, wherein a central position of each of the bright regions coincides with a central position of a region where a corresponding first sub-pixel is located.

10. The 3D display device according to claim 1, wherein the grey scales of the first sub-pixels corresponding to a same bright region are set to be the same, so as to make the 3D display device in a 2D display mode.

11. A driving method for the 3D display devices according to claim 1, comprising:
- controlling regions of an electroluminescence display panel disposed under a liquid crystal display panel to form columns of bright regions and columns of dark regions, which are arranged alternately; and
- controlling first sub-pixels, which correspond to a same bright region, of the liquid crystal display panel to display different grey scale information, so as to make the 3D display device in a 3D display mode; wherein,
- in the 3D display portrait mode, each column of bright regions comprises bright regions with a same emitting color, and adjacent columns of bright regions have different emitting colors; and
- in the 3D display landscape mode, each column of bright regions comprises bright regions, which are adjacent in the column direction, with different emitting colors, and the emitting colors of the bright regions, which are provided in a same row, of each column of the bright regions are the same.

12. The driving method according to claim 11, further comprising:
- in the 2D display mode, controlling the first sub-pixels, which correspond to a same bright region, in the liquid crystal display panel to display same grey scale information.

13. The driving method according to claim 11, further comprising:
- in the 3D display landscape mode, controlling to form the dark regions between the bright regions, which are adjacent in the column direction, with different emitting colors.

14. The driving method according to claim 11, wherein,
- in the 3D display portrait mode, each of the bright regions corresponds to N adjacent first sub-pixels, which are provided in a row, wherein N is an even numbers;
- N/2 first sub-pixels on the left side and N/2 first sub-pixels on the right side of the first sub-pixels corresponding to a same bright region is controlled to display different grey scales; and
- in the 3D display landscape mode, each of the bright regions corresponds to M*N first sub-pixels, which are provided in N rows, adjacent in the row direction or in the column direction, wherein M is an even numbers; M*N/2 first sub-pixels on the left side and M*N/2 first sub-pixels on the right side of the first sub-pixels corresponding to a same bright region is controlled to display different grey scales.

* * * * *